US007129965B2

(12) United States Patent
Iwamatsu et al.

(10) Patent No.: US 7,129,965 B2
(45) Date of Patent: Oct. 31, 2006

(54) EXPOSURE DEVICE AND IMAGE FORMING DEVICE

(75) Inventors: Tadashi Iwamatsu, Nara (JP); Shigeru Nishio, Sakai (JP); Tetsuya Inui, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 298 days.

(21) Appl. No.: 10/501,509

(22) PCT Filed: Jan. 9, 2003

(86) PCT No.: PCT/JP03/00140

§ 371 (c)(1), (2), (4) Date: Jul. 15, 2004

(87) PCT Pub. No.: WO03/059628

PCT Pub. Date: Jul. 24, 2003

(65) Prior Publication Data

US 2005/0151824 A1 Jul. 14, 2005

(30) Foreign Application Priority Data

Jan. 16, 2002 (JP) ............................. 2002-007146

(51) Int. Cl.

| | |
|---|---|
| ***B41J 2/447*** | (2006.01) |
| ***H05B 33/02*** | (2006.01) |
| ***H01L 27/32*** | (2006.01) |
| ***H01L 51/50*** | (2006.01) |

(52) U.S. Cl. ...................................................... 347/237

(58) Field of Classification Search ................ 347/224, 347/225, 233, 238
See application file for complete search history.

(56) References Cited

U.S. PATENT DOCUMENTS

| | | | | |
|---|---|---|---|---|
| 5,043,632 | A * | 8/1991 | Asars et al. | 315/169.3 |
| 5,252,895 | A * | 10/1993 | Leksell et al. | 313/506 |
| 5,258,690 | A * | 11/1993 | Leksell et al. | 313/512 |
| 6,297,842 | B1 * | 10/2001 | Koizumi et al. | 347/237 |

FOREIGN PATENT DOCUMENTS

JP 3-138893 A 6/1991

(Continued)

OTHER PUBLICATIONS

Thin Film El Edge Emitter Head, Kaname Iga et al., Journal of the Society of Electrophotography of Japan,vol. 30, No. 4, 1991, pp. 112-116.

*Primary Examiner*—Huan Tran
(74) *Attorney, Agent, or Firm*—Birch, Stewart, Kolasch & Birch, LLP

(57) ABSTRACT

An emissive element array of a plurality of organic EL elements is arranged linearly on a single-crystal silicon substrate or polycrystalline silicon substrate with a drive circuit including an element switching its respective emissive element. The organic EL emissive elements have an edge emitting structure utilizing light emitted in an edge direction perpendicular to the direction of deposition of electrode layers and organic compound layers, and is constructed such that the emitting area of one emisive element, S, as viewed in the direction of deposition, and the period of emissive elements disposed side by side, d, have the relationship of $S>d^2$. In this way, organic EL techniques can be applied to provide the required amount of light exposure and to produce an exposure device that is small and inexpensive.

13 Claims, 7 Drawing Sheets

FOREIGN PATENT DOCUMENTS

| | | | |
|---|---|---|---|
| JP | 3-187189 | A | 8/1991 |
| JP | 4-237993 | A | 8/1992 |
| JP | 5-4377 | A | 1/1993 |
| JP | 5-57953 | A | 3/1993 |
| JP | 9-114398 | A | 5/1997 |
| JP | 2002-103678 | A | 4/2002 |

* cited by examiner

EXPOSURE DEVICE AND IMAGE FORMING DEVICE

TECHNICAL FIELD

The present invention relates to exposure devices and image forming devices used with digital electrophotographic devices for exposing a photosensitive material to light to form a visible image with toner, and more particularly, to optical printer heads employing organic electroluminescent (EL) elements.

BACKGROUND ART

Conventionally, LSUs for scanning with a laser beam or an LED array with LEDs disposed in one line are commonly used as exposure devices for creating an electrostatic latent image in a photosensitive material. An LSU requires a polygon mirror rotated at tens of thousands of revolutions per minute (rpm), has a long optical path and requires a large number of optical components such as a lens. Accordingly, it is difficult to produce LSUs of smaller size and to adapt them to be operated at still higher speeds.

An LED array is generally constructed of a substrate of a III-V group compound semiconductor such as GaAs, resulting in high cost of material. Further, it requires a technique of precisely arranging a plurality of LED chips each having a plurality of light emissive elements, and also requires a drive circuit chip on a single-crystal silicon substrate to be connected to LED chips of GaAs using wire bonding, making it more difficult to reduce the cost.

Since higher resolution requires emissive elements to be integrated more densely, wire bonding constraining interconnection with the driver IC from being made more densely is particularly problematic. One known solution is "time division driving," which divides one line of LEDs into eight blocks, for example, to provide eight emissions shifted along the time axis. This will advantageously relieve the density of interconnection between the densely disposed emissive elements and the driver IC, alleviating load due to wire bonding.

Specifically, when light is produced by 64 emissive elements with 20 micron pitch, 8 block time division driving with an interconnection in a matrix can reduce the number of lines connecting with the driver IC to 16 (8+8=16) and reduce the connection pitch to 80 microns, which is 4 times the pitch of each emissive element (64/16=4).

However, in the above example with 8 elements in one block, the required amount of light needs to be obtained in a time period 8 times smaller than is the case when time division driving is not performed, requiring more amount of light (emission intensity per unit of time) of an emissive element. Specifically, the required amount of light is 8 times larger than is the case when time division driving is not performed. Further, time division driving requires image data to be rearranged, thereby increasing the scale of circuitry.

Consequently, LED arrays, while smaller than LSUs and thus significantly more advantageous in size, are disadvantageous compared to LSUs in terms of cost and performance and thus have not gained popularity.

Instead of using emission principles of LEDs, an exposure device employing inorganic ELs is disclosed in the *Journal of the Society of Electrophotography of Japan*, Vol. 30, No. 4, 1991.

Besides these exposure devices, performances of organic ELs have been significantly improved in recent years, leading to ongoing considerations of putting these devices to use in display applications. Since organic ELs are employed with displays, the substrate is generally a transmissive glass or resin substrate, although the use of a single-crystal silicon substrate is disclosed in Japanese Patent Laying-Open No. 9-114398. It discloses the use of a single-crystal silicon substrate to provide a smaller matrix configuration of driving devices and a greater aperture efficiency in surface emission, the ability to prevent degradation due to thermal fatigue, and the like.

An exposure device employing such inorganic ELs, however, requires an alternating-current high voltage pulse with 250 volts for driving the device and has a low response rate at several hundreds of μsec. and other problems, which have hampered its commercialization.

Also, when an organic EL of the surface emission type for use with displays is to be applied in an exposure head of a printer, one serious problem arises as to how to provide the required amount of light for illuminating a photosensitive material.

For example, assuming the sensitivity of a common organic photosensitive material, E, to be 0.5 [$\mu J/cm^2$], the process rate V to be 120 [mm/s] and the resolution R to be 600 [dpi], then the required energy on the surface of the photosensitive material, W, is generally calculated using the following equations: when the assumed values provided above are substituted into the equation: $W=E/(25.4/W/V)$, a representation in SI notation is: $W=14$ [$W/m^2$].

Further, the organic EL of the surface emission type is characterized by a large angle of radiation, which is advantageous for a display due to a larger angle of field, but causes a problem for an exposure head of a printer because, in an exposure head that requires image optics, a larger angle of radiation results in less efficient use of light in the optics.

Supposing the efficiency of use of light in optics to be at 10%, the required amount of light from a light source is 140 [$W/m^2$]. For a resolution of 1200 dpi, the required amount of light is two times larger. Providing this amount of light using an inorganic EL is extremely difficult without compromising the lifetime of the organic EL.

Another problem occurs in conjunction with imaging optics. Specifically, when a device using an array of emissive elements such as LEDs is employed for an exposure head of a printer, the optics generally have a lateral magnification of one time, as in a rod lens array. When printing on an A3 paper, for example, the required width of an image surface corresponds to the width of an A3 paper i.e. approximately 300 mm, so that an array of emissive elements may have a width of about 300 mm for optics with a lateral magnification of one time.

In the case of magnifying or reducing optics, the load on imaging optics is increased for removing aberration due to a larger angle of view, so that providing a smaller size is difficult. In addition, reducing optics has a width of an array of emissive elements larger than 300 mm.

When using imaging optics with a lateral magnification of one time such as a rod lens array, the size of an image spot is larger than that of the source due to aberrations of a lens or MTF degradation. The required size of an image spot ranges from about 60 to 80 microns for a resolution of 600 dpi, and ranges from about 30 to 50 microns for 1200 dpi. The size of an emitting portion of an LED source is several microns and therefore may be considered as a point source, which results in a smaller load on the imaging optics, realizing the above size.

On the other hand, in the case of an organic EL of the surface emission type, increasing the emitting area to compensate for an insufficient amount of light as mentioned above results in a correspondingly increased size of the source (i.e. its emitting area). In other words, for an organic EL of the surface emission type, there is a trade-off between the increase in the amount of light and the load upon the imaging optics. Consequently, it is theoretically impossible to provide an emitting surface that is larger than the size of the required image spot for optics with a lateral magnification of one time.

DISCLOSURE OF THE INVENTION

Various embodiments of the present invention have been made to overcome the above problems. and address the cost and technological problems of LEDs as mentioned above by making the most use of organic EL to apply it to an exposure device, thereby producing an exposure device that is small and inexpensive.

An exposure device according to an embodiment of the present invention includes: a substrate; an emissive element array provided on the substrate and having a plurality of organic EL emissive elements arranged linearly; and a drive circuit provided on the substrate and including an element switching the organic EL emissive element, where the organic EL emissive element has an edge emission structure emitting light in an edge direction that is perpendicular to a direction of deposition of electrode layers and organic compound layers, and the emitting area of one emissive element, (S), as viewed in the direction of deposition, and the period of the emissive elements disposed side by side, (d), satisfy the relationship of $S>d^2$.

In this way, an organic EL emissive element may be monolithically formed on a substrate including drive circuitry so that an interconnection by e.g. wire bonding is unnecessary, thereby allowing a low cost, high-density interconnection. Further, a plurality of organic EL emissive elements may correspond to circuit elements for switching the emissive elements on a one-to-one basis, allowing simultaneous emission across one line. Further, the time of emission for one emissive element can be maximized, thereby reducing the amount of light emitted per unit of time. That is, an advantageous structure may be realized with respect to brightness and lifetime, both of which have been described as concerns about organic ELs.

In one embodiment of the above exposure device, the organic compound layers have a thickness that is smaller than a central emission wavelength, and the exposure device has an optical waveguide layer with a thickness greater than the central emission wavelength on the side of the electrode layer opposed to the organic compound layers. More preferably, the optical waveguide layer has a first transparent layer of a refractive index of n1 in contact with the organic EL emissive element and a second transparent layer with a refractive index of n2 in contact with a portion of the first transparent layer that is out of contact with the organic EL emissive element, where the refractive index of the first transparent layer, n1, and the refractive index of the second transparent layer, n2, satisfy the relationship of n1>n2.

Thus constructing an external optical waveguide layer separate from the emitting layer allows light to be guided not solely within the organic layers, which cause much loss, but also on the outside of the thin film electrode, allowing light to be received in the optical waveguide layer and then efficiently propagated up to the edge. In other words, the efficiency of use of light is advantageously improved. It is recognized that transparency here means being sufficiently transmissive to light of the emission wavelength of an organic EL, and the refractive index means a refractive index with respect to main emission wavelengths.

In an embodiment of the exposure device, the organic compound layers on the side of the electrode layer that is opposed to the first transparent layer have a refractive index, n3, that is smaller than the refractive index of the first transparent layer, n1. This can achieve a smaller percentage of light propagated in the optical waveguide layer that returns to the emitting layer, thereby improving the efficiency of use of light.

The exposure device may have a light-absorbing shading wall between the optical waveguide layers that each correspond to one of the organic EL emissive elements. If necessary, the exposure device has a shading wall that is non-transmissive to light and light-absorbing between adjacent ones of the organic EL emissive elements. In this way, crosstalk of light from an adjacent optical waveguide layer can be prevented, thereby providing a high-quality image. It is recognized that being light-absorbing (non-transmissive to light) means being sufficiently non-transmissive to light of the emission wavelength of an organic EL.

In an embodiment of the exposure device, the organic EL emissive element is constructed by providing the first electrode layer overlying the substrate, providing the organic compound layers overlying the first electrode layer, and providing the second electrode layer overlying the organic compound layers, where the second electrode layer is made of a transmissive electrode material and the optical waveguide layer is provided on the second electrode layer. This provides an effective dissipation from the silicon substrate of heat generated during emission in the organic EL portion.

In an embodiment of the exposure device, the optical waveguide layer has a second transparent layer with a refractive index of n2 provided on the substrate and a first transparent layer with a refractive index of n1 generally surrounded by the second transparent layer, where the organic EL emissive element is constructed by providing the first electrode layer overlying the optical waveguide layer, providing the organic compound layers overlying the first electrode layer, and providing the second electrode layer overlying the organic compound layers. This can minimize the number of the process steps for the formation of thin films overlying the organic layers, which are susceptible to heat and shock, thereby facilitating the manufacture and allowing a potentially lower cost.

In an embodiment of the exposure device, a groove is provided in the substrate and the second transparent layer and the first transparent layer are provided within the groove. Also, more preferably, a light-absorbing shading film is provided between the inner wall surface of the groove and the second transparent layer.

In an embodiment of the exposure device, the organic compound layers have a three-layer structure of an emitting layer with a refractive index of n4 and sandwiching layers with a refractive index of n5 sandwiching the emitting layer and having electron and hole transporting materials mixed together, the refractive index of the emitting layer, n4, and the refractive index of the sandwiching layers, n5, satisfy the relationship of n4>n5, and the exposure device also has a shading wall that is non-transmissive to light and light-absorbing between adjacent ones of the organic EL emissive elements. By providing this symmetrical waveguide structure of organic compound layers themselves, light can be efficiently guided without requiring an external waveguide even when the thin films have a total thickness smaller than the emission wavelength.

In some embodiment, the substrate may be a single-crystal silicon substrate or a polycrystalline silicon substrate.

Finally, an image forming device according to an embodiment of the present invention includes the above exposure device and a photosensitive material exposed to light by the exposure device.

BEST MODES FOR CARRYING OUT THE INVENTION

Embodiments according to the present invention will be described below with reference to the accompanying drawings.

(First Embodiment)

Figure 1:
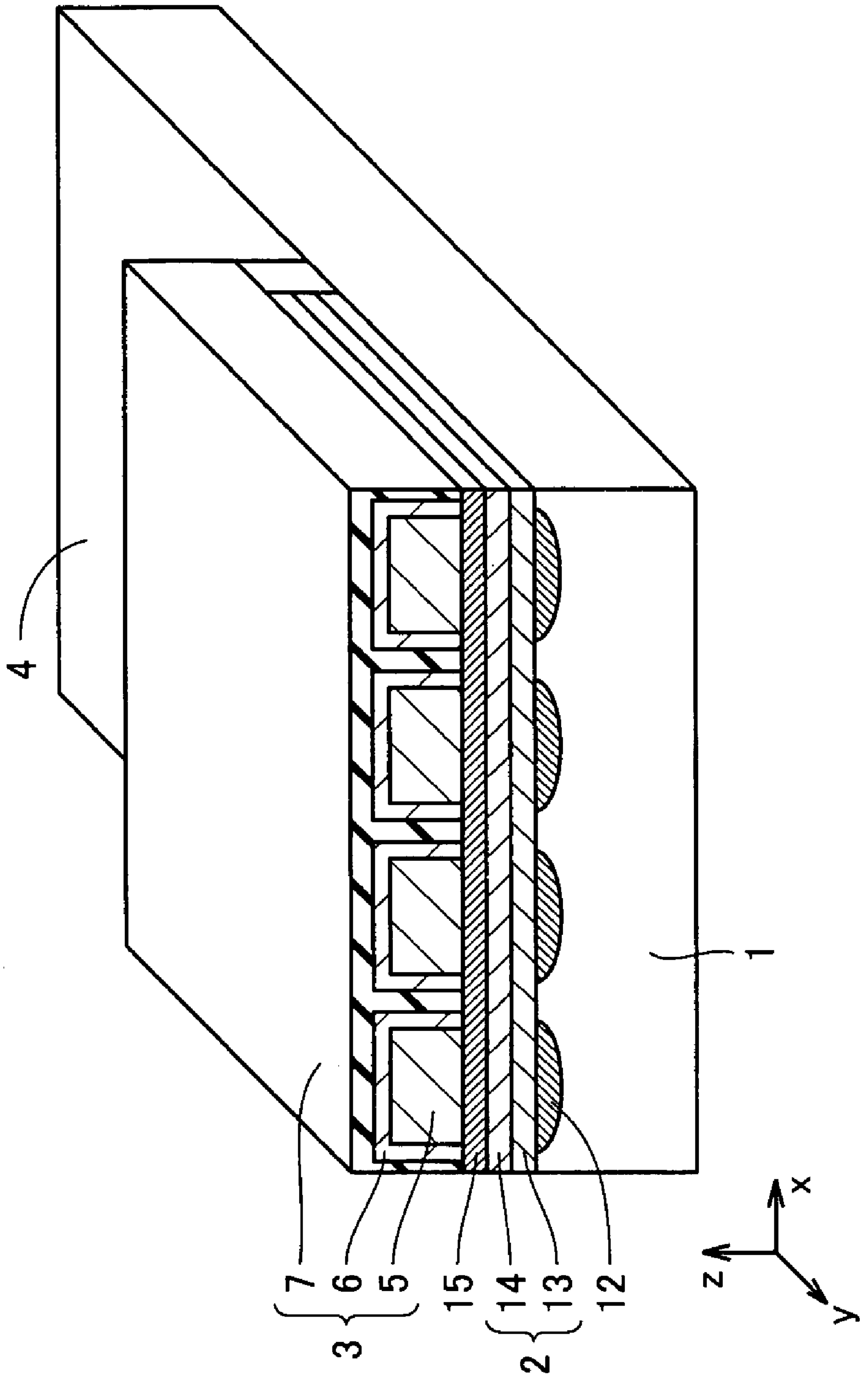
FIG. 1 shows a first schematic cross sectional view of the structure of an exposure device according to a first embodiment of the present invention.

FIG. 1 shows a schematic cross sectional view of the structure of one exemplary exposure device with an anode provided on a single-crystal silicon substrate 1. The substrate is shown being made of single-crystal silicon as one example. Referring to FIG. 1, the exposure device is provided with a driver circuit portion 4 including drive circuitry, an anode 12, a hole transporting layer 13, an electron transporting and emitting layer 14, a cathode 15, an optical waveguide core layer 5, an optical waveguide clad layer 6, and a shading wall 7. Of the xyz coordinates in FIG. 1, the direction z is the direction of deposition of the layers and the direction y is the direction of edge emission, and an edge emitting structure is employed where an organic EL emissive element 2 emits light in the edge direction (direction y) perpendicular to the direction of deposition of the electrode layers and organic compound layers (direction z).

Figure 2:
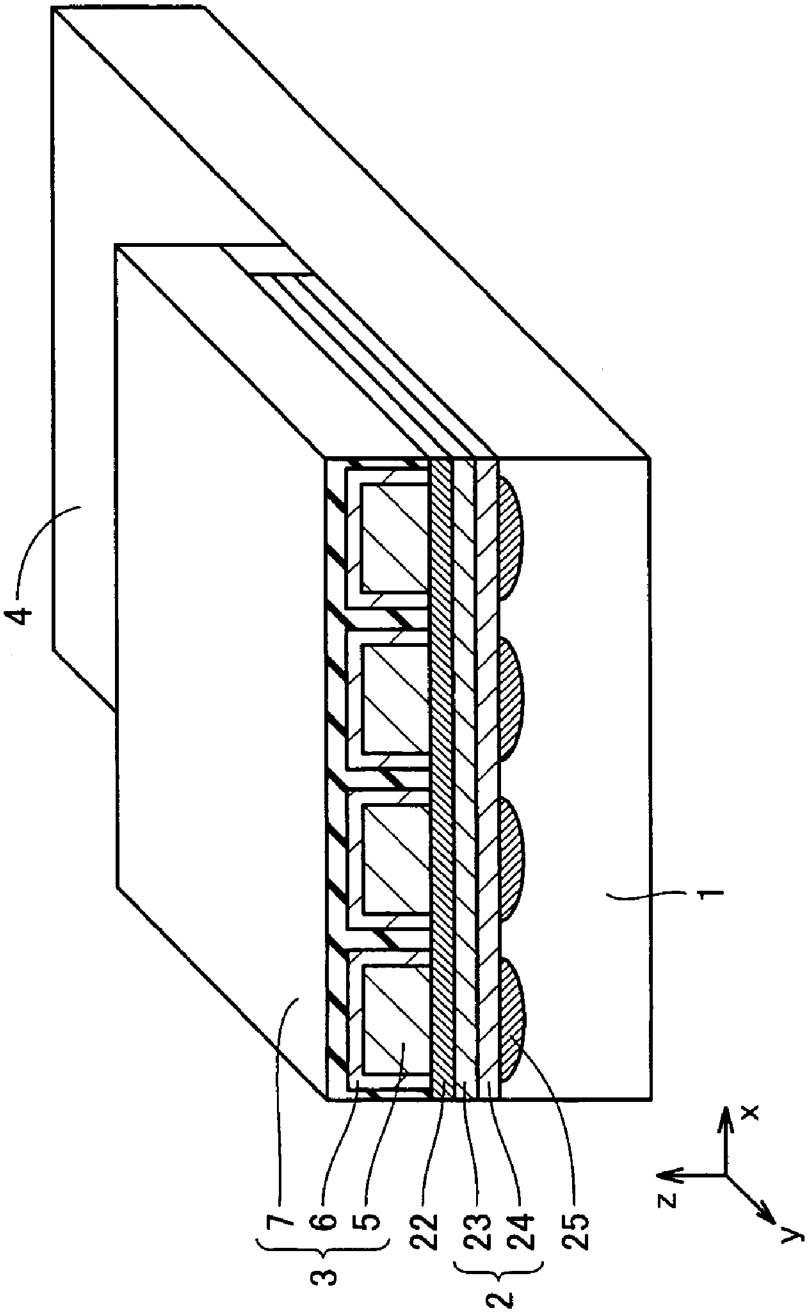
FIG. 2 shows a second schematic cross sectional view of the structure of the exposure device according to the first embodiment of the present invention.

FIG. 2 shows a schematic cross sectional view of the structure of one exemplary exposure device with a cathode provided on a single-crystal silicon substrate 1. Referring to FIG. 2, the exposure device is provided with a driver circuit portion 4, an anode 22, a hole transporting layer 23, an electron transporting and emitting layer 24, a cathode 25, an optical waveguide core layer 5, an optical waveguide clad layer 6, and a shading wall 7. Of the xyz coordinates in FIG. 2, the direction z is the direction of deposition of the layers and the direction y is the direction of edge emission, and an edge emitting structure is employed where an organic EL emissive element 2 emits light in the edge direction (direction y) perpendicular to the direction of deposition of the electrode layers and organic compound layers (direction z).

Single-crystal silicon substrate 1 as in FIGS. 1 and 2 has a driver circuit portion 4 for controlling switching of the organic EL emissive elements based on image information. Driver circuit 4 includes, for example, a shift register circuit for serial-parallel conversion of image information, a data latch circuit, and a field-effect transistor (FET) circuit for controlling switching of an electric current flowing into the organic EL layers, and the like. If necessary, it includes a circuit portion for correcting variations in the amount of light from each element.

When the element that controls switching is an FET, a first electrode layer is connected to the source or drain of the FET to supply current to the organic EL layers and is provided on the same single-crystal silicon substrate 1. The shape of the first electrode layer substantially defines that of the emitting surface.

In the exposure device with a structure as shown in FIG. 1, the first electrode layer is anode 12 where the material may be ITO deposited on a P-type silicon or N-type silicon. In the exposure device with the structure shown in FIG. 2, the first electrode is cathode 25 where the material may be a lithium-aluminum alloy.

Electrode materials deposited on single-crystal silicon substrate 1 or poly-crystal silicon substrate 1 will be described in more detail.

A plurality of electrodes deposited on single-crystal silicon substrate 1 for forming a plurality of organic EL elements may be fabricated by doping to provide P-type or N-type silicon, for example, or by patterning a metal such as aluminum or copper, using methods involving, for example, an IC manufacturing technique such as photolithography. The first electrode, which is closer to the switching circuit, may be an anode or cathode with respect to the organic EL element.

When the first electrode is anode 12 as shown in FIG. 1, a material with a large work function is required for the first electrode. A variety of methods may be used, such as one using P-type silicon, patterning a material such as ITO (work function of about 4.6 eV), gold (work function of about 5.2 eV) or tin oxide [$SnO_2$], or patterning an organic material such as polyaniline for the anode. P-type silicon, N-type silicon, aluminum or copper may be patterned to form the electrodes, before forming thereon an anode material with a large work function, such as ITO.

Before forming an organic layer (hole transporting layer 13) on anode 12, a buffer layer, not shown, may be provided as needed. The buffer layer may be made of a metallic oxide with a large work function such as vanadium oxide, molybdenum oxide or ruthenium oxide, or copper phthalocyanine [CuPc], starburst amine [m-MTDATA], polyaniline or the like, to reduce a barrier against injection to the hole transporting layer.

When the anode is made of ITO, a UV-ozonation or oxygen plasma process may be performed to achieve a work function of 5.0 eV or more, reducing the barrier against injection to the hole transporting layer.

When the first electrode is cathode 25 as shown in FIG. 2, a material with a small work function is required for the first electrode. Various methods may be used, such as one using N-type silicon, or patterning an alloy of magnesium and silver [Mg:Ag], or aluminum, lithium, magnesium, calcium, or alloys thereof. P-type silicon, N-type silicon, aluminum or copper may be patterned to form the electrodes before forming thereon a cathode material with a small work function such as an alloy of magnesium and silver.

Before forming an organic layer (electron transporting layer 24) on cathode 25, a buffer layer, not shown, may be provided as needed. The buffer layer may be made of an alkali metal compound such as LiF, MgO or the like, an alkali earth metal compound such as $MgF_2$, $CaF_2$, $SrF_2$, $BaF_2$ or the like, or an oxide such as $Al_2O_3$, to improve the efficiency in electron ejection or the stability of the electrode material.

The organic compound layers between the two electrode layers i.e. anode 12 (22) and cathode 15 (25) will be described below.

In FIG. 1, above anode 12 are formed hole transporting layer 13, electron transporting and emitting layer 14, and cathode 15. The material of hole transporting layer 13 may be amine-based N,N'-diphenyl-N,N'-bis (3-methylphenyl)-1,1'-biphenyl-4,4'-diamine (hereinafter referred to as TPD); the material of electron transporting and emitting layer 14 may be tris (8-quinolinolate) aluminum complex (hereinafter referred to as Alq3).

(Formula 1)

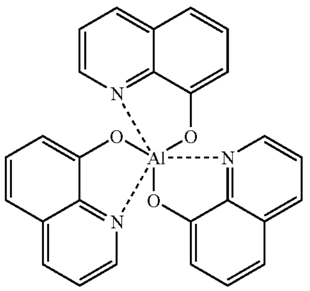

Alq3

(Formula 2)

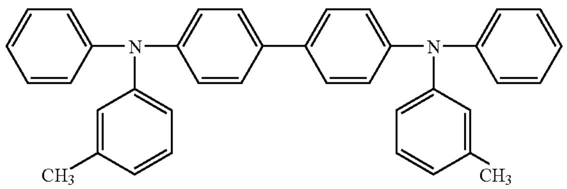

TPD

In FIG. 2, above cathode 25 are formed electron transporting and emitting layer 24, hole transporting layer 23, and anode 22. The material of hole transporting layer 23 may be amine-based TPD, and the material of electron transporting and emitting layer 24 may be Alq3.

In the above embodiment, the organic compound layers has a two-layer structure (single heterostructure) of a low molecular-weight material, although it may have a three layer-structure (double heterostructure) of a hole transporting layer, an emitting layer and an electron transporting layer, and it may also has a multilayer structure with more separated functions. It may also have a monolayer or multilayer structure of a high-polymer based material. Further, the organic compound materials are not limited to those described above.

The organic compound materials will be described in more detail. It is important for an organic EL element material to control the energy barrier with respect to an adjacent organic layer or an electrode. To facilitate the injection of charge, the energy barrier should be minimized between the work function of cathode 15 (25) and the lowest unoccupied molecular orbital (LUMO) of electron transporting layer 14 (24), and between the work function of cathode and anode 12 (22) and the highest occupied molecular orbital (HOMO) of hole transporting layer 13 (23). Further, in a two-layer structure as in FIGS. 1 and 2, a large barrier is required between the LUMO levels of electron transporting layer 14 (24) and hole transporting layer 13 (23) along the interface between electron transporting layer 14 (24) and hole transporting layer 13 (23) in order to prevent electrons from entering hole transporting layer 13 (23). Also in a multilayer structure, it is important to design a structure and material so as to establish a similar energy barrier.

It is also important to have a number of injected holes as close to that of injected electrons as possible and use a heat resisting material, to provide an efficient and stable emission. Various materials have been proposed to satisfy these design issues.

For example, there are numerous known materials for the electron transporting layer which include, besides Alq3 presented above, 2-(4-biphenyl)-5-(4-tert-butylphenyl)-1,3,4-oxadiazole (PBD); 2,5-bis (1-napthyl)-1,3,4-oxadiazole (BND); α-NPD; and 1,3,5-tris [5-(4-tert-butylphenyl)-1,3,4-oxadiaole] benzene (TPOB) with improved heat resistance, and hole transporting materials that include, besides TPD presented above, starburst based 4,4',4"-tris (3-methylphenyl phenyl amino) triphenylamine (m-MTDATA) with improved heat resistance.

(Formula 3)

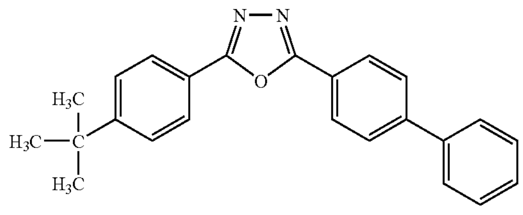

PBD (Formula 4)

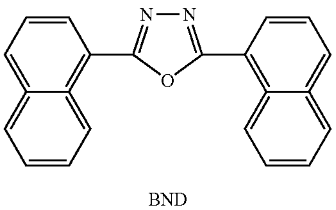

BND (Formula 5)

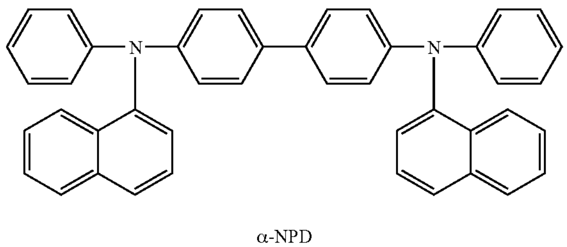

α-NPD

-continued (Formula 6)

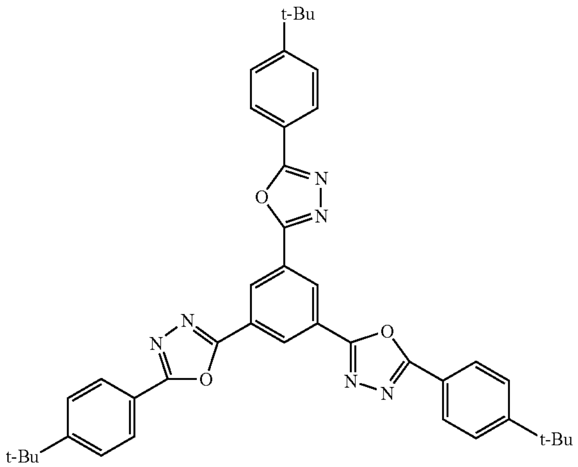

TPOB (Formula 7)

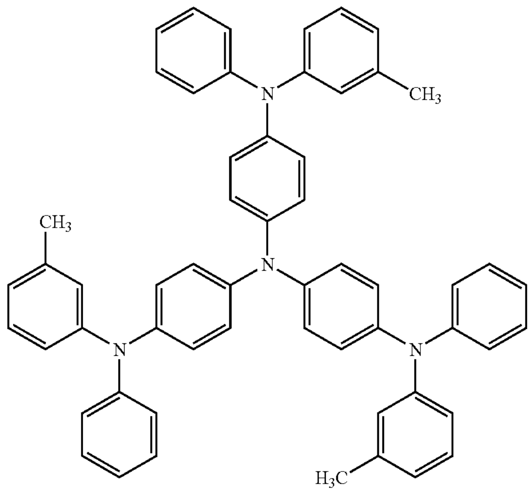

m-MTDATA

Also, various light emissive materials have been proposed to provide desired emission wavelengths. When an emissive material is used for a photosensitive material exposure head, phthalocyanine organic photosensitive materials which are mainly used at present exhibit high sensitivity within the range from red to infrared. Consequently, the emission wavelength of an organic EL is desired to be in the wavelength range of these photosensitive materials. When an organic EL has an emission wavelength within the range from blue to red, however, the photosensitive material may be changed accordingly. An exemplary emissive material is one that emits green light for Alq3. The known materials exhibiting emission near red include BPPC [perylene derivative], Eu (TTA) 3 (phen) [Eu complex], Nile Red.

(Formula 8)

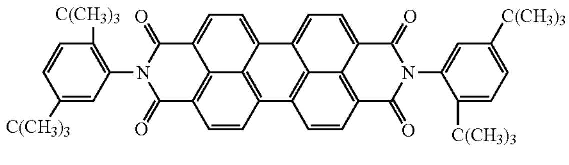

BPPC (Formula 9)

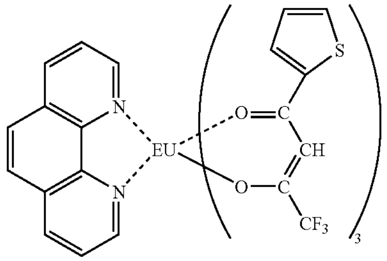

Eu(TTA)3(phen)

(Formula 10)

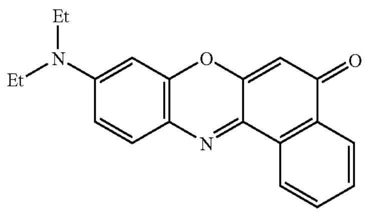

Nile Red

Besides, phosphorescence from triple optical status may be used to significantly improve the efficiency in light emission, where the known materials include red BtOEP [platinum-porphyrin complex], green Ir (ppy) 3 [iridium complex].

(Formula 11)

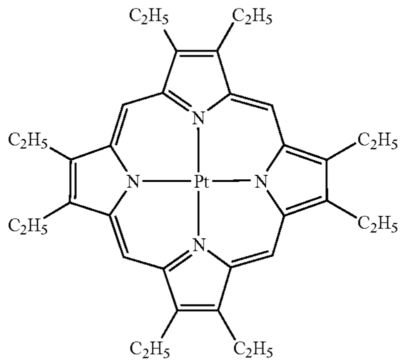

PtOEP (Formula 12)

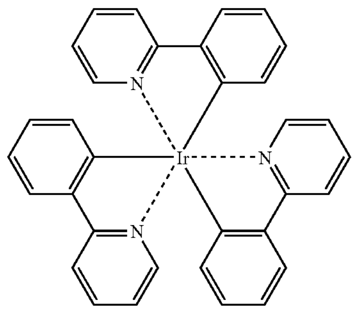

Ir(ppy)3

Next, the second electrode layer overlying the organic compound layers will be described. The material of this electrode is also decided based on similar considerations as those for the first electrode material, as described above.

The second electrode layer is cathode 15 in FIG. 1 and anode 22 in FIG. 2.

In FIGS. 1 and 2, cathode 15 is composed of a thin film of Al, ZnO or the like, and anode 22 is composed of an ITO thin film or the like. The second electrode layer is required to be highly transmissive in order to guide light to optical waveguide layer 3 provided thereabove. A wide gap semiconductor thin film is one typical material that possesses the two properties of being electrically highly conductive so as to function as an electrode and being highly transmissive to light. Examples include ITO, zinc oxide, tin oxide and the like.

Generally, sputtering is used to form films of ITO, where sputtering may cause atoms having a high energy of several tens of eV to enter the substrate, damaging layers. When the second electrode layer is formed of ITO overlying the organic layers as described above, a protective layer of perylene tetracarboxylic acid dianhydride (PTCDA), for example, may be vapor-deposited by 4 nm before ITO is sputtered, to avoid damages to the organic layers.

The silicon substrate will now be described in more detail. When the process rate V is 120 [mm/s] and the resolution in the process direction, R1, is 1200 [dpi], for example, then the time it takes to perform exposure for one line, S1, is up to 176 μsec. from the following equation:

$$S1=25.4/R1/V.$$

When the resolution in the line direction perpendicular to the above process direction, R2, is 1200 [dpi], and since an A3 paper has a width of 298 mm, the time it takes to transfer data for one dot, S2, is 12.5 nsec. from the following equation:

$$S2=S1/(R2\times 298/25.4)$$

The circuit portion on single-crystal silicon substrate 1 includes, for example, a shift register circuit for serial-parallel conversion of image information, a data latch circuit, and a field effect transistor (FET) circuit for controlling switching of a current flowing into the organic EL layers. Of course, data processing can be performed within the time period mentioned above when the material of the circuit substrate is single-crystal silicon; however, a polycrystalline silicon substrate can also be used depending on design constraints such as the desired circuit scale, substrate size or the like.

Next, the optical waveguide will be described in detail. Organic compounds used for an organic EL element are often an insulating material, requiring them to be made into thin films that are then stacked on each other. Accordingly, the total thickness of the organic compound layers between the two electrode layers (for example, anode 12 and cathode 15) generally ranges from several tens to several hundreds of nanometers. This leads to a total thickness of the organic compound layers that is smaller than the wavelength of emitted light, making it difficult to trap light within the organic compound layers without loss and to guide light up to an edge.

That is, the intensity of light guided to an edge is attenuated due to the absorption of light energy by electrons in an electrode layer external to the organic compound layers or due to the loss of light transmitted, through the electrode layer. Accordingly, when the total thickness of the organic compound layers is smaller than the wavelength of emitted light, optical waveguide layer 3 is provided so as to make use of light that has seeped out of the thin film electrode. For example, the total thickness of the organic compound layers is smaller than the central emission wavelength of the organic compound layers, and an optical waveguide layer is provided that has a thickness greater than the central emission wavelength on the side of the electrode layer that is opposed to the organic compound layers. It should be noted that the central emission wavelength means the wavelength with the greatest intensity of light.

Also, optical waveguide layer 3 has a first transparent layer with a refractive index of n1 in contact with the organic EL emissive element and a second transparent layer with a refractive index of n2 in contact with a portion of the first transparent layer that is not in contact with the organic EL light emissive element, where the refractive index of the first transparent layer, n1, and the refractive index of the second transparent layer, n2, preferably satisfy the relationship of n1>n2. Thus constructing an external optical waveguide layer separate from the emitting layer allows light to be guided not solely within the organic layers, which cause much loss, but also on the outside of the thin film electrode, allowing light to be received in the optical waveguide layer and then efficiently propagated up to the edge. In other words, the efficiency of use of light is advantageously improved. Preferably, the organic compound layers on the side of the electrode layer that is opposed to the first transparent layer have a refractive index, n3, that is smaller than the refractive index of the first transparent layer, n1. This can achieve a smaller percentage of light propagated in the optical waveguide layer that returns to the emitting layer, thereby improving the efficiency of use of light.

For example, in FIGS. 1 and 2, optical waveguide layer 3 is composed of optical waveguide core layer 5 for receiving light seeping out of cathode 15 or anode 22, optical waveguide clad layer 6 for totally reflecting light from optical waveguide core layer 5 at a desired angle and guiding light to an edge, and shading wall 7 for preventing crosstalk.

To provide an optical waveguide structure, the core layer has a refractive index greater than that of the clad layer. The core and clad layers may be made of an organic material such as PMMA [polymethyl metahcrylate methyl] or PS [polystyrene] or an inorganic material such $SiO_2$, patterned corresponding to the plurality of organic EL emitting portions.

When the optical waveguide layer is made of an organic material such as those as desribed above, some measures should be taken during manufacturing to prevent the underlying organic EL layers from being eroded by an organic solvent. Also, when the optical waveguide layer is made of an inorganic material such as $SiO_2$, it is usually formed at high energy and high temperature using vacuum deposition, for example, where measures should be taken in manufacturing to prevent the underlying organic EL layers from being altered or destroyed by the heat generated during the formation of the films.

The optical waveguide needs to have a thickness that is sufficiently larger than the emission wavelength to improve the efficiency in light propagation, and thus is formed with a thickness of several microns. Finally, shading wall 7 is formed from a material that is non-transmissive to light of the emission wavelength. The optical waveguide and shading wall 7 also serve as a protective-film for protecting the organic EL from degrading due to atmospheric moisture, providing a highly effective structure for achieving a longer lifetime of the element.

In an optical waveguide as shown in FIGS. 1 and 2, the refractive index of the core layer is larger than that of the clad layer, and the waveguide is three-dimensional, where optical waveguide clad layer 6 has a significant thickness in its portion in contact with the surface of the electrode (cathode 15 in FIG. 10).

This is for the purpose of efficiently guiding light generated from the organic EL portion to the optical waveguide, and of facilitating the manufacture. To prevent light that has entered optical waveguide core layer 5 from returning to the organic EL layer which could cause a loss in the amount of light, a clad layer may be provided in contact with the electrode layer, although the refractive index of the organic EL layers may more effectively be used. Specifically, the refractive index of an organic EL layer that is in contact with the side of the electrode layer opposed to optical waveguide core layer 5 may be smaller than the refractive index of the core layer. Thus, the organic EL layer may be regarded, to some extent, as a clad layer, improving the efficiency in guiding light by utilizing total reflection.

By thus providing an optical waveguide and having a structure for taking light out of an edge, it is also possible to efficiently take out light emitted at a position distant in the direction of depth (direction-y) from the edge. Thus, providing emitting surfaces of the organic ELs shaped in a plurality of strips extending in the depth direction can overcome the above-mentioned problem of insufficient amount of light.

Specifically, the shape of an emitting edge can remain the same even when the emitting area of the organic EL is made larger to increase the amount of light taken out of the edge, thereby solving the problem of the optics with a lateral magnification of one time. It should be noted that the emitting area of an organic EL is indicated by the area of anode 12, in FIG. 1, measured in the XY plane, and more specifically, the area defined by the width of anode 12 in the direction X and the depth of hole transporting layer 13 in the direction Y. The period of emissive elements disposed side by side on an edge is limited by the resolution. For example, when the elements are disposed in one line and the resolution is 600 dpi, the period d is 42.3 μm. Similarly, for the resolution of 1200 dpi, it is 21.2 μm. The limit of the emitting area S for surface emission is generally equal to $d^2$ due to constraints by lateral magnification as discussed above, while, for edge emission, the emission surfaces may be provided in a plurality of strips extending in the depth direction (direction-y) to increase the emitting area S. That is, the emitting portion can be configured in such a way that the period of emissive elements disposed side by side on an edge remains equal to the distance therebetween defined by resolution and under the condition of $S>d^2$, thereby overcoming the problem of insufficient amount of light.

For example, when assuming the sensitivity of a typical organic photosensitive material, E, to be 0.5 [μJ/cm$^2$], the process rate V to be 120 [mm/s], the resolution R to be 600 [dpi], and the efficiency in use of light in the optics [O] to be 10%, then the required energy for one surface emissive element where $S=d^2$ is generally calculated by the following equation:

$$W=E\div(25.4\div R\div V)\div O.$$

The assumed value of 600 dpi is then substituted thereto to give W=140 [W/m$^2$], when represented by the SI unit.

When the resolution is 1200 dpi, the required energy for one emissive element is:

$$W=280[W/m^2].$$

Figure 6:
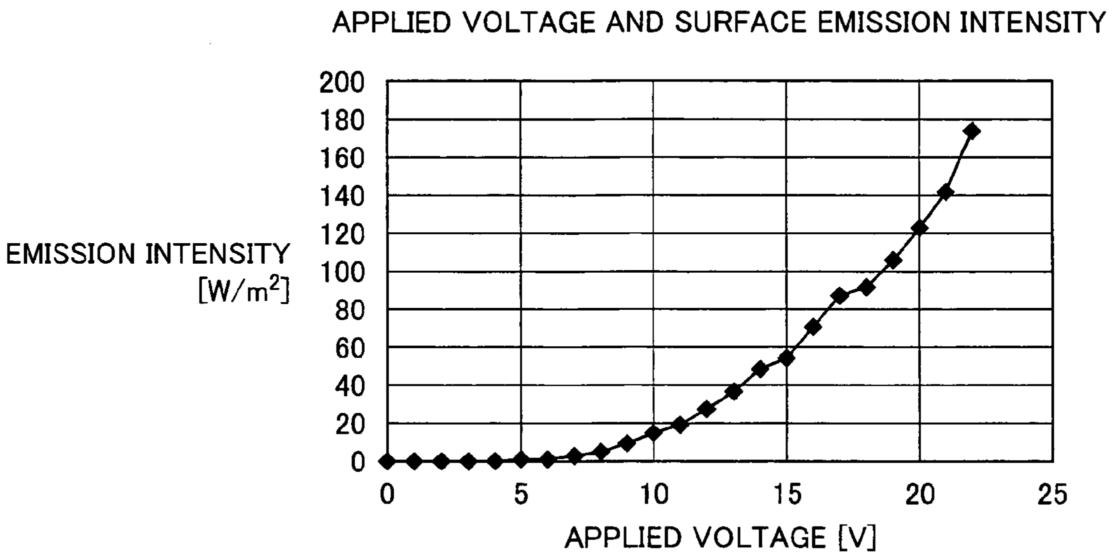
FIG. 6 illustrates the correlation between the driving voltage and emission intensity of an organic EL of the surface emission type.

FIG. 6 shows results from measuring the relationship between the applied voltage and the surface emission intensity. The prototype organic EL element measured was constructed of an anode of ITO, an anode buffer layer of CuPc (copper phthalocyanine), a hole transporting layer of α-NPD, an electron transporting layer of Alq3, a cathode buffer layer of LiF, and a cathode of Al. Characteristically, the current density and the emission intensity of the element are increased exponentially as the applied voltage is increased. When the applied voltage was increased to 22.2 V, the maximum emission intensity of 175 [W/m$^2$] was reached and the element was destroyed.

Other experiments have shown that the lifetime of an organic EL element decreases inversely with the emission intensity to the power of one to two, and thus it is desirable to use it at an emission intensity equal to or less than 1/10 of the above-mentioned emission intensity that could cause destruction, to satisfy the required lifetime of an element when used for an exposure device of a printer. This, too, indicates that the surface emission type is impractical since the EL element, when used as an emissive element, desirably has a light amount density less than several tens of [W/m$^2$], when converted to surface emission. The problem of insufficient amount of light can be overcome by having a discontinuous emission surface and providing an edge emission structure that includes an optical waveguide as described above.

A heat dissipation structure is an important means of providing a longer lifetime for an organic EL element. Among organic compounds used for an organic EL, Alq3, for example, which is an electron transporting material, has a relatively high glass transition temperature of 175° C., whereas that of TPD, a hole transporting material, is low and lies at about 60° C., and heat resistance is an issue to be addressed. When the element is at a high temperature, the material itself is altered and its amorphousness is compromised, decreasing the emission intensity. Although a variety of attempts have been made to improve the material and novel materials have been proposed, providing a heat dissipation structure is also important. As shown in FIGS. 1 and 2, an organic EL portion is first formed on single-crystal silicon substrate 1 which has a good heat conductivity to allow efficient dissipation through the silicon substrate, providing a longer lifetime for the element.

(Second Embodiment)

Figure 3:
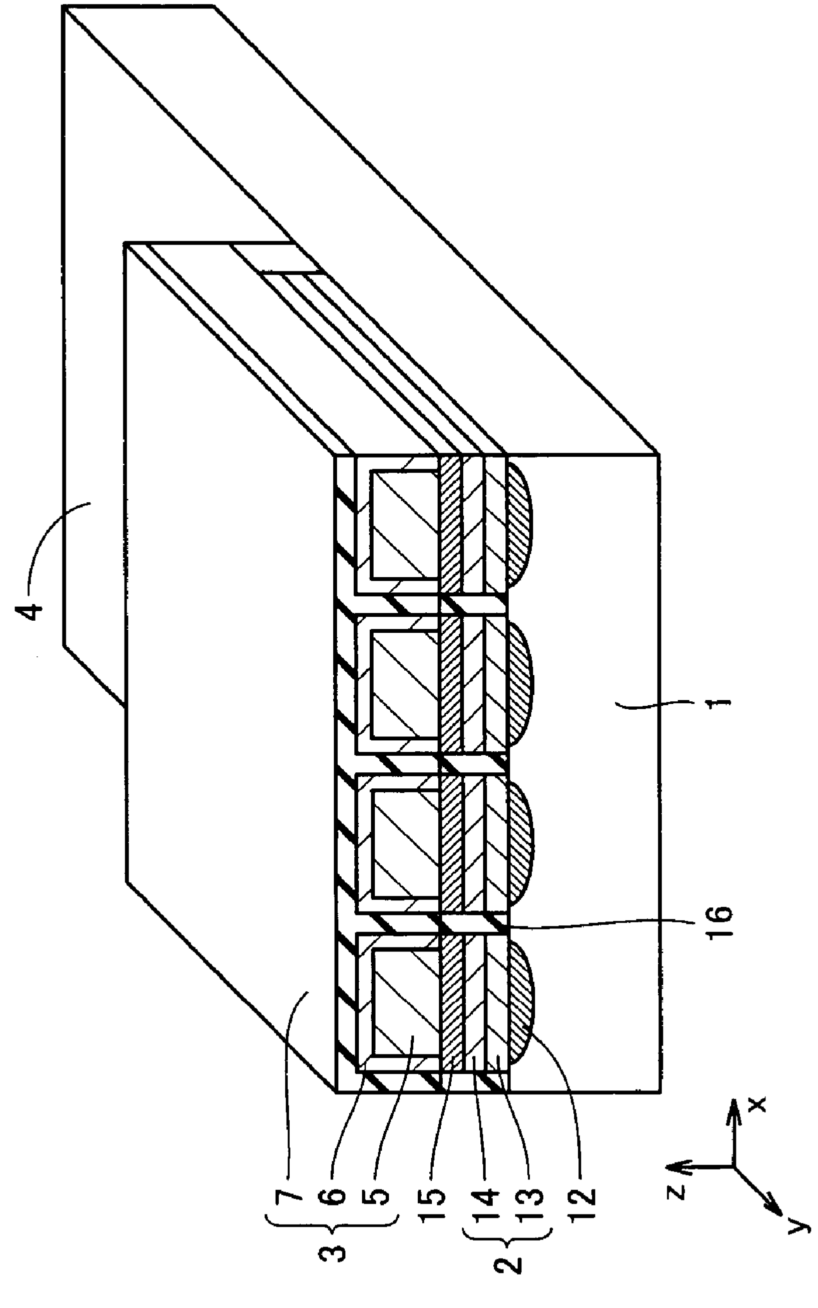
FIG. 3 shows a schematic cross sectional view of the structure of an exposure device according to a second embodiment of the present invention.

Turning to FIG. 3, an exposure device according to a second embodiment will be described. The prerequisites for a structure as shown in FIGS. 1 and 2 are that the amount of light propagated along optical waveguide layer 3 is sufficiently larger than the amount of light propagated along organic EL emissive element 2 and that the crosstalk of light in organic EL emissive element 2 is negligible. However, constraints due to the material, such as refractive index, or those due to the structure, such as film thickness, may cause the amount of light propagated along organic EL emissive element 2 to be relatively large. Then, crosstalk of light in organic EL emissive element 2 becomes a problem. Specifically, light emitted from an element adjacent to a non-emissive element is propagated to the non-emissive region so that light is emitted from an edge of the non-emissive region. Crosstalk in the exposure head forms an image in a location that should be a non-imaging section, degrading the image significantly.

To solve such problems, an exposure device according to the present embodiment is constructed with an additional shading wall 16, as in FIG. 3, between adjacent organic EL emissive elements 2. Although this adds to the patterning process for organic EL emissive elements 2, it advantageously prevents crosstalk. Although FIG. 3 illustrates anode 12 being first formed on single-crystal silicon substrate 1, it is recognized from the discussions above that a cathode may also be formed first. Also, the organic compound layers of an organic EL emissive element are not limited to the two-layer type as shown in FIG. 3. Further, the hole transporting layer may include the function of an emitting layer. The substrate may be a single-crystal silicon substrate as well as polycrystalline silicon substrate. When the substrate is made of single-crystal silicon or polycrystalline silicon, the substrate can include at least part of circuitry for driving the organic ELs.

(Third Embodiment)

Figure 4:
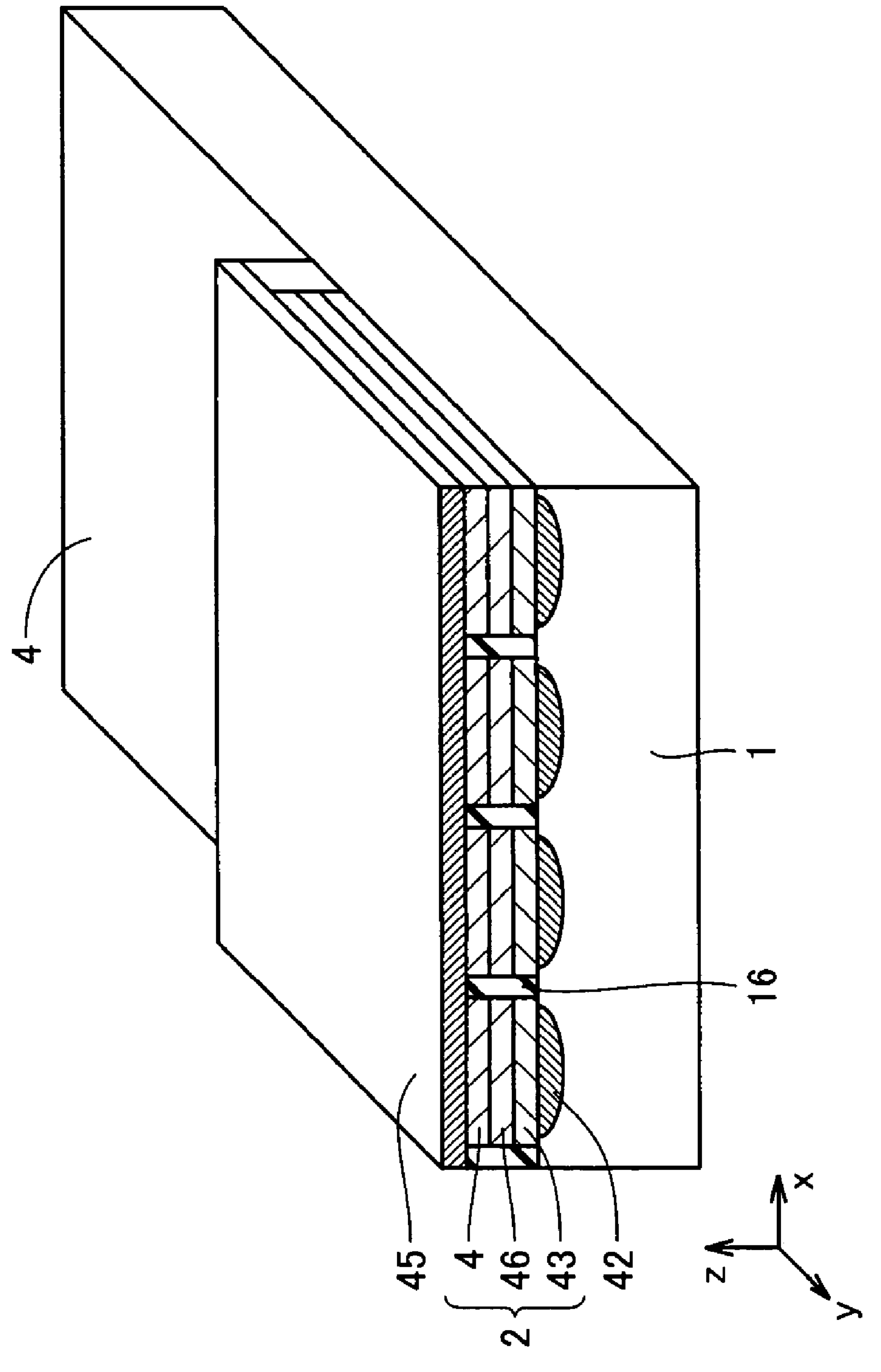
FIG. 4 shows a schematic cross sectional view of the structure of an exposure device according to a third embodiment of the present invention.

Turning to FIG. 4, an exposure device according to a third embodiment will be described. Constructing an exposure device as shown in FIG. 4 can improve the efficiency in light propagation in organic EL emissive element 2 without optical waveguide layer 3.

The organic compound layers have a three-layer structure with an emitting layer with a refractive index of n4 and sandwiching layers with a refractive index of n5 for sandwiching the emitting layer and having an electron transporting material and a hole transporting material mixed together, where the refractive index of the emitting layer, n4, and the refractive index of the sandwiching layers, n5, satisfy the relationship of n4>n5, and a shading wall that is non-transmissive to light and light-absorbing is provided between adjacent ones of the organic EL emissive elements.

For example, when organic EL emissive element 2 has a three-layer structure as shown in FIG. 4, organic EL emissive element 2 includes the function of an optical waveguide, and emitting layer 46 serves as a core layer with a high refractive index while electron and hole transporting layers 44 and 43 serve as clad layers with a low refractive index. Requirements for improving the efficiency in taking out light are that emitting layer 46 of Alq3 or the like forms a core layer, and that the clad layers above and below it are formed by vapor-depositing both electron and hole transporting materials, providing a symmetrical waveguide with refractive indices in a symmetry.

For example, both TPD and oxadiazole derivative (hereinafter referred to as OXD) may be vapor-deposited on the layers above and below Alq3 to provide the same refractive indices, thereby fulfilling the functions of transporting both electrons and holes. Further, to prevent crosstalk, a shading wall 16 may be provided between adjacent organic EL emissive elements 2 to fulfill the function as an exposure head. Also, the organic compound layers themselves may have a symmetrical waveguide structure to allow light to be guided efficiently without requiring an external waveguide even when the films have a total thickness smaller than the emission wavelength.

(Fourth Embodiment)

Figure 5:
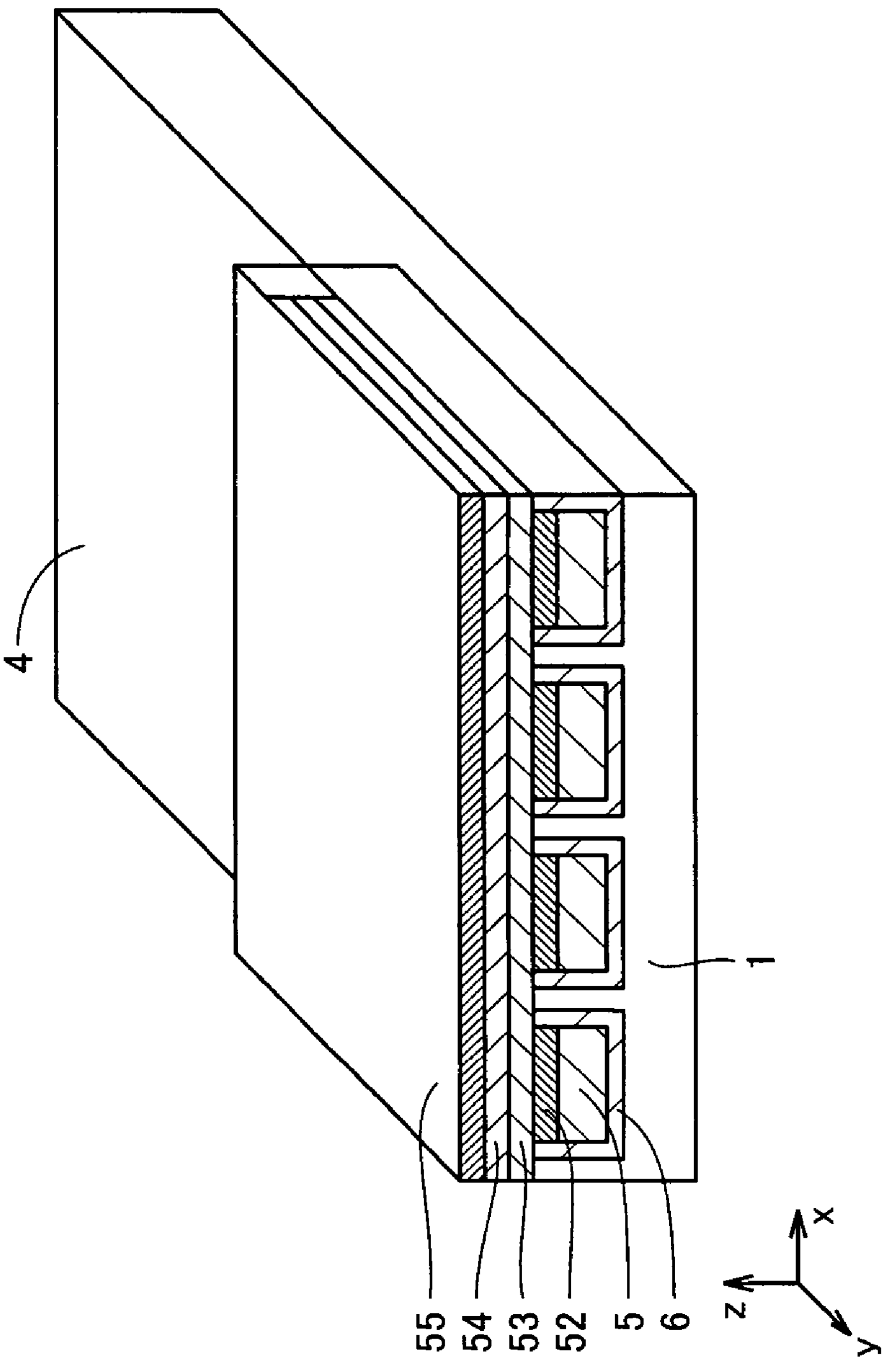
FIG. 5 shows a schematic cross sectional view of the structure of an exposure device according to a fourth embodiment of the present invention.

Turning to FIG. 5, an exposure device according to a fourth embodiment will be described. A groove is first formed on a single-crystal silicon substrate 1 and an optical waveguide core layer 5 and an optical waveguide clad layer 6 are formed. Anode 52 is then formed by patterning, and hole transporting layer 53, and then electron transporting and emitting layer 54 are formed and finally cathode 55 is formed. In such a structure, a groove is used to facilitate the patterning for the optical waveguide portion.

In this way, in a structure where optical waveguide layers are first formed on the silicon substrate, a high-energy film formation process may be used such as sputtering for forming an optical waveguide layers and a lower electrode layer without causing damage because the underlying silicon substrate can resist thermal shock. This facilitates the manufacturing when constructing the optical waveguide portion with an inorganic material such as $SiO_2$. Further, when forming the lower electrode layer such as an anode of ITO or the like, the underlying $SiO_2$ or silicon, which can resist thermal shock, facilitates the manufacture. In this way, when an optical waveguide portion is first formed on the silicon substrate and an organic EL emissive element is then formed thereupon, constraints during formation of the films such as thermal shock are alleviated, thereby facilitating the manufacture. Further, the silicon substrate can include the function of a shading wall, thereby allowing a simpler structure. Also, when the optical waveguide layers are constructed from an organic material, an inorganic material is underlying and thus not easily eroded by organic solvent, allowing wet methods and other methods for forming the films, advantageously alleviating constraints during formation of the films.

Silicon is transmissive to infrared, requiring attention when the emission wavelengths include much infrared and the photosensitive material is sensitive to infrared. In this case, the problem of crosstalk is solved by forming a light-absorbing shading film for infrared between single-crystal silicon substrate 1 and optical waveguide clad layer 5.

Although FIG. 5 shows anode 52 being first formed overlying the optical waveguide, it is recognized from the above discussions that a cathode may also be formed first. Further, the organic compound layers of an organic EL emissive element are not limited to the two-layer type as shown in FIG. 5, and the hole transporting layer may include the function of an emitting layer. The substrate may be a single-crystal as well as polycrystalline silicon substrate.

When the substrate is made of single-crystal or polycrystalline silicon, the substrate may include at least part of circuitry for driving the organic EL.

(Fifth Embodiment)

Figure 7:
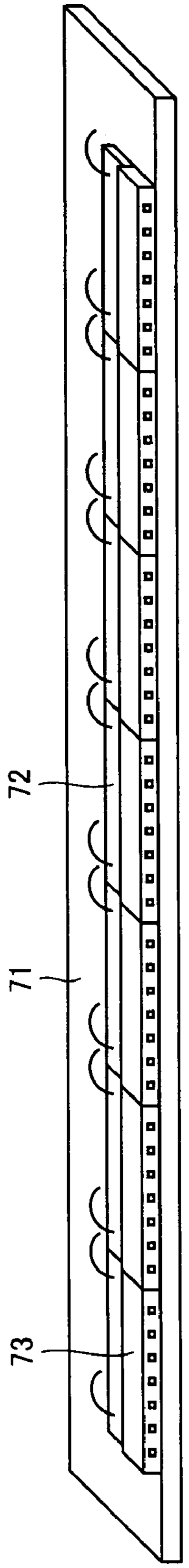
FIG. 7 shows a schematic cross sectional view of the structure of an exposure device according to a fifth embodiment of the present invention.

Turning to FIG. 7, an exposure device according to a fifth embodiment will be described.

FIG. 7 is a schematic structural view illustrating an exposure device according to the present invention. For a resolution of 600 dpi, when 1024 organic EL emissive elements and driver circuitry are provided on a silicon substrate to form one silicon chip 72, the resulting structure includes seven chips arranged in one line on substrate 71. For a resolution of 1200 dpi, when 1024 organic EL emissive elements and driver circuitry are similarly provided on a silicon substrate to form one silicon chip, the resulting structure includes 14 chips arranged in one line on the substrate. Also, a rod lens array 73 is provided parallel to the silicon chips for forming an image from light emitted from an edge of the organic EL emissive elements. This exposure device allows an exposure for the width of an A3 paper (about 300 mm), thereby realizing a printer or copier for up to A3 papers. Thus, an image forming device may be constructed by including an exposure device according to the above embodiments and a photosensitive material illuminated by the exposure device.

It should be understood that the disclosed embodiments are, in all respects, by way of example and not by way of limitation. The scope of the present invention is set forth by the claims rather than the above description and is intended to include all the modifications within the spirit and scope equivalent to the scope of the claims.

(Effects of the Invention)

In an exposure device and an image forming device based on the present invention described above, an organic EL emissive element is formed with an edge emission structure to solve various problems such as insufficient amount of light for an exposure device (exposure head), and an exposure device and an image forming device (exposure device) can be provided that is small and inexpensive.

The invention claimed is:

1. An exposure device comprising:

a substrate;

an emissive element array provided on said substrate and having a plurality of organic EL emissive elements arranged linearly; and a drive circuit provided on said substrate and including an element switching said organic EL emissive element, wherein said organic EL emissive element has an edge emission structure emitting light in an edge direction that is perpendicular to a direction of deposition of electrode layers and organic compound layers, and an emitting area of one emissive element, (S), as viewed in said direction of deposition, and a period of the emissive elements disposed side by side, (d), satisfy the relationship of $S>d^2$.

2. The exposure device according to claim 1, wherein said organic compound layers have a thickness that is smaller than a central emission wavelength, and said exposure device has an optical waveguide layer with a thickness greater than said central emission wavelength on a side of said electric layer opposed to said organic compound layers.

3. The exposure device according to claim 2, wherein said optical waveguide layer has a first transparent layer of a refractive index of n1 in contact with said organic EL emissive element and a second transparent layer with a refractive index of n2 in contact with a portion of said first transparent layer that is out of contact with said organic EL emissive element, and the refractive index of said first transparent layer, n1, and the refractive index of said second transparent layer n2, satisfy the relationship of n1>n2.

4. The exposure device according to claim 3, having a light-absorbing shading wall between said optical waveguide layers that each correspond to one of said organic EL emissive elements.

5. The exposure device according to claim 3, wherein said organic compound layers on a side of said electrode layer opposed to said first transparent layer has a refractive index, n3, that is smaller than the refractive index of said first transparent layer, n1.

6. The exposure device according to claim 2, wherein said organic EL emissive element is constructed by providing said first electrode layer overlying said substrate, providing said organic compound layers overlying said first electrode layer, and providing said second electrode layer overlying said organic compound layers, and said second electrode layer is made of a transmissive electrode material, and said optical waveguide layer is provided on said second electrode layer.

7. The exposure device according to claim 2, wherein said optical waveguide layer has a second transparent layer with a refractive index of n2 provided on said substrate and a first transparent layer with a refractive index of n1 generally surrounded by said second transparent layer, and said organic EL emissive element is constructed by providing said first electrode overlying said optical waveguide layer, providing said organic compound layers overlying said first electrode layer, and providing said second electrode layer overlying said organic compound layers.

8. The exposure device according to claim 7, wherein a groove is provided in said substrate, and said second transparent layer and said first transparent layer are provided within said groove.

9. The exposure device according to claim 8, wherein a light-absorbing shading film is provided between an inner wall surface of said groove and said second transparent layer.

10. The exposure device according to claim 1, having a shading wall that is non-transmissive to light and light-absorbing between adjacent ones of said organic EL emissive elements.

11. The exposure device according to claim 1, wherein said organic compound layers have a three-layer structure of an emitting layer with a refractive index of n4 and sandwiching layers with a refractive index of n5 sandwiching said emitting layer and having electron and hole transporting materials mixed together, the refractive index of said emitting layer, n4, and the refractive index of said sandwiching layers, n5, satisfy the relationship of n4>n5, and said exposure device has a shading wall that is non-transmissive to light and light-absorbing between adjacent ones of said organic EL emissive elements.

12. The exposure device according to claim 1, wherein said substrate is a single-crystal silicon substrate or a polycrystalline silicon substrate.

13. An image forming device including an exposure device and a photosensitive material exposed to light by said exposure device, said exposure device comprising:

a substrate;

an emissive element array provided on said substrate and having a plurality of organic EL emissive elements arranged linearly; and a drive circuit provided on said substrate and including an element switching said organic EL emissive element, wherein said organic EL emissive element has an edge emission structure emitting light in an edge direction that is perpendicular to a direction of deposition of electrode layers and organic compound layers, and an emitting area of one emissive element, (S), as viewed in said direction of deposition, and a period of the emissive elements disposed side by side, (d), satisfy the relationship of $S>d^2$.

* * * * *